United States Patent [19]

Pernici

[11] Patent Number: 5,170,133
[45] Date of Patent: Dec. 8, 1992

[54] LOW-NOISE AMPLIFIER WITH HIGH INPUT IMPEDANCE, PARTICULARLY FOR MICROPHONES

[75] Inventor: Sergio Pernici, Bergamo, Italy

[73] Assignee: SGS-Thomson Microelectronics S.r.l., Agrztz Brianza, Italy

[21] Appl. No.: 669,898

[22] Filed: Mar. 14, 1991

[30] Foreign Application Priority Data

Mar. 22, 1990 [IT] Italy .................. 19769 A/90

[51] Int. Cl.$^5$ ........................... H03F 3/45
[52] U.S. Cl. ................... 330/253; 330/300; 381/120
[58] Field of Search ........... 330/253, 300, 260, 261; 381/120, 121

[56] References Cited

U.S. PATENT DOCUMENTS 4,833,422  5/1989  Atwell ..................... 330/300 X

OTHER PUBLICATIONS

E. A. Vittoz, "MOS Transistors Operated in the Lateral Bipolar Mode and Their Application in CMOS Technology", *IEEE Journal of Solid-State Circuits*, vol. SC-18, No. 3, pp. 273-279, Jun., 1983.

*Primary Examiner*—James B. Mullins

[57] ABSTRACT

The amplifier includes a pair of bipolar input transistors (Q1, Q2), each having a base adapted to receive a differential input signal, a collector and an emitter which is biased by a first fixed current source (M7, M8) of its own and a degeneration resistor (R) which connects the emitters of the two bipolar transistors. The collector of each bipolar transistor is also biased by a second fixed current source (M5, M6) with a smaller current than that of the first source, and the collectors of the two bipolar transistors are furthermore connected to the input terminals of respective MOS amplifier devices (M1, M2, M3, M4, $R_L$). The amplifier can be made in BCD, BiCMOS or purely CMOS technology, in which case the bipolar transistors are obtained as lateral bipolar transistors.

6 Claims, 2 Drawing Sheets

LOW-NOISE AMPLIFIER WITH HIGH INPUT IMPEDANCE, PARTICULARLY FOR MICROPHONES

The present invention relates to a low-noise amplifier with high input impedance. In one aspect the amplifier is particularly suitable for use as microphone amplifier in the field of telephony. The amplifier can be made in CMOS technology or in a mixed technology (BiCMOS, BCD) to be included in mixed analog and digital integrated circuits.

The recent evolution of circuit integration methods has allowed one to integrate an increasingly large number of analog and digital functions on a single integrated circuit. This is particularly evident in the field of telephony, in which it has recently become possible to combine in a single mixed integrated circuit (BCD, BiCMOS) digital functions in MOS technology and analog functions in bipolar technology.

However, as is known, bipolar technology is more expensive than MOS technology, occupies more area and dissipates more power, besides the fact that mixed technology is intrinsically complicated and therefore expensive. On the other hand, the use of analog functions or amplifiers in MOS technology is hindered by the higher noise which is typical of these circuits with respect to bipolar ones. Another hindrance is the low supply voltage which is generally available for said microphone amplifiers (since said voltage is drawn from the telephone line current).

The aim of the invention is therefore to provide an amplifier entirely or predominantly in CMOS technology, which has low noise and is thus suitable for being integrated as microphone amplifier in telephone circuits. A further object is to provide said amplifier with high input impedance.

Another object is to provide said amplifier so that it can operate even with a low power supply voltage (even less than 3 V).

The invention achieves this aim, these objects and other objects and advantages such as will become apparent from the continuation of the description with a differential amplifier which comprises a pair of bipolar input transistors, each having a base adapted to receive a differential input signal, a collector and an emitter which is biased by a first fixed current source of its own, and a degeneration resistor which connects the emitters of said two bipolar transistors, characterized in that the collector of each bipolar transistor is also biased by a second fixed current source of its own, with a smaller current than that of said first source, and in that the collectors of said two bipolar transistors are furthermore connected to the input terminals of respective MOS amplifier devices. The invention is now described in greater detail with reference to some preferred embodiments, illustrated in the accompanying drawings, which are given by way of non-limitative example and wherein:

Figure 1:
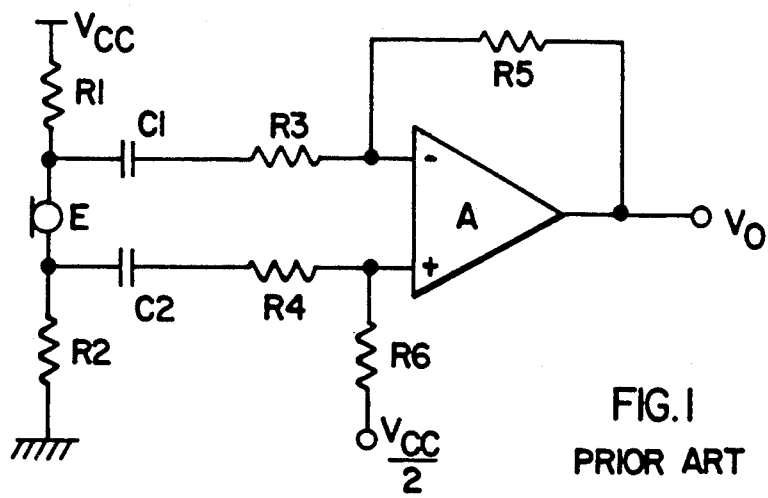
FIG. 1 is a circuit diagram of a microphone circuit according to the prior art.

With reference to FIG. 1, which illustrates a typical microphone circuit of the prior art, an electret microphone E with differential output, biased by resistors R1, R2, drives, through capacitors C1, C2 for direct-current insulation, the two inputs of an operational amplifier A, with input resistors R3, R4, a feedback resistor R5 and a bias resistor R6. The amplifier A must have low noise and low distortion.

Figure 2:
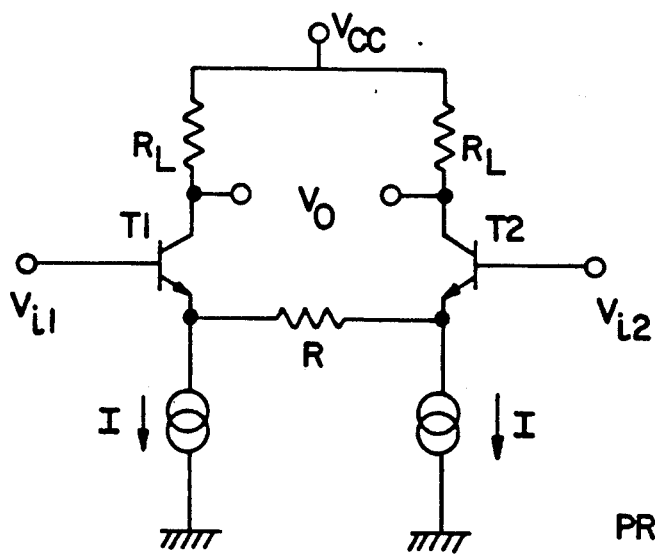
FIG. 2 is a circuit diagram of a bipolar microphone amplifier according to the prior art.

If the amplifier is manufactured in CMOS technology, it must be dimensioned with very large input transistors in order to have a low noise, with an undesirable area expenditure. Furthermore, since R3 and R4 must be much higher than the output impedance of the microphone (which is typically 1 kohm) in order to avoid signal attenuation, and since R5 must in turn be much higher than R3 and R4 (since the amplifier must provide an appreciable gain), this leads to a further considerable area expenditure, also due to the fact that said resistors must have a good linearity since they directly affect the linearity of the circuit. As is known, resistors manufactured with lower-resistivity materials are in fact the most linear; typically, polysilicon resistors, with a specific resistance of 20–30 ohm/per square, are much more linear than those with n-well or p-well diffusion, which have a typical resistance of 1–4 kohm/per square. Another known solution of low-noise amplifier is illustrated in FIG. 2, and comprises a bipolar input amplifier formed by two transistors T1, T2, with collector resistors $R_L$ and with an emitter degeneration resistor R. The transistors T1, T2 are biased by fixed current sources I, which can be in either bipolar or CMOS technology. On the basis of the equivalent circuit for small signals, the following ratio can be easily obtained as gain of the amplifier:

$$2\beta R_L/(2r_{be}+\beta R)$$

where $\beta$ is the current gain of the bipolar transistors and $r_{be}$ is the total base-emitter resistance. For high values of $\beta$, the gain is approximately $2R_L/R$. The input resistance is approximately $2r_{be}+\beta R$, if $\beta$ is not very large, and if an excessively large R is to be avoided, this value is relatively low.

Figure 3:
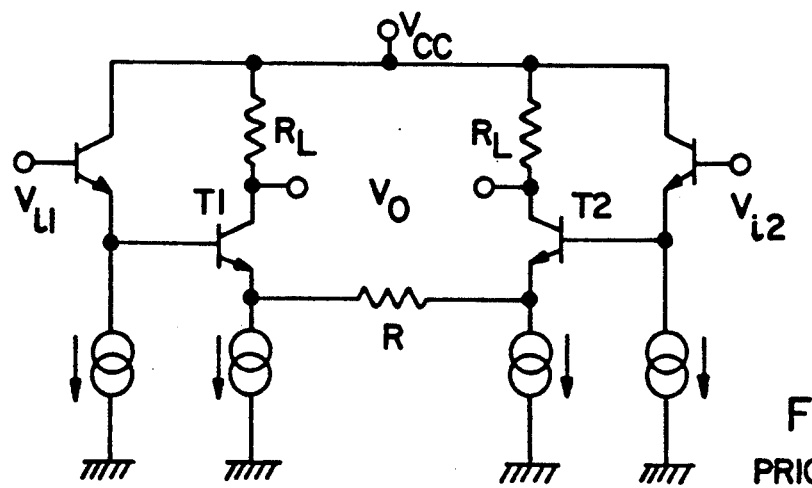
FIG. 3 is a circuit diagram of another bipolar microphone amplifier according to the prior art.

In order to obviate the problem of the low input impedance of the circuit of FIG. 2, it is known to modify the circuit according to the circuit of FIG. 3, in which two input transistors, with associated fixed current sources, have been added so as to form Darlington connections. The input impedance is thus increased, but the larger number of components inserted between the power supply and the ground also requires a higher minimum supply voltage, and the noise increases as well.

Figure 4:
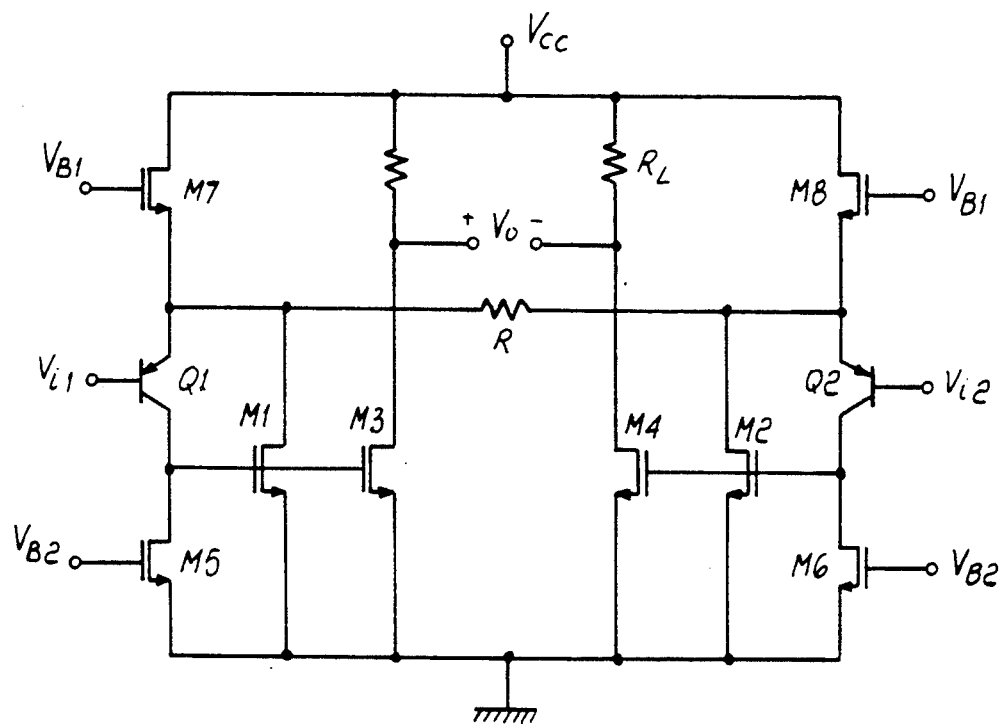
FIG. 4 is a circuit diagram of a microphone amplifier according to a preferred embodiment of the invention.

FIG. 4 illustrates an amplifier according to the preferred embodiment of the invention. Two CMOS transistors M1, M2 are driven by respective bipolar transistors Q1, Q2. Said bipolar transistors are biased by current sources M5, M6 on their collectors (adjusted by a fixed voltage $V_{B2}$) and by current sources M7, M8 on their emitters (adjusted by a fixed voltage $V_{B1}$). The current generated by M7 (or M8) is higher than the current generated by M5 (or M6), and the difference current flows in the transistor M1 (or M2). The emitters of Q1 and Q2 are connected by a degeneration resistor R. The currents which flow in M1 and M2 are mirrored in respective CMOS transistors M3, M4 and flow in respective load resistors $R_L$.

Each of the two pairs of MOS transistors M1, M3 and M2, M4, together with the associated load resistor $R_L$, thus constitutes a MOS amplifier device, and the two devices together form a differential amplifier stage.

When a differential signal $V_{i1}$, $V_{i2}$ is applied to the bases of the transistors Q1, Q2, said transistors behave like voltage followers. Therefore, ignoring second-order effects, a voltage equal to the input voltage $V_i = V_{i1} - V_{i2}$ occurs on the resistor R, with a current $V_i/R$, which flows almost exclusively in M1 and M2, since the currents in Q1 and Q2 are fixed by the sources M5 and M6 and vary to a negligible extent with the input signal. The current variations in Q1 and Q2 are in fact exclusively those required to vary the gate voltages of M1 and M2 (which are high-impedance points) so that these two MOS components absorb the current variation developed in R. It is evident that if the dimensions of M1 and M3 (and of M2 and M4) are identical, the differential voltage gain between the input and the output is very close to $2R_L/R$ even for rather low values of $\beta$. This value is the same which was obtained with the known circuit of FIG. 2, in which however $\beta$ was assumed to be very high.

The circuit of FIG. 4 can therefore replace the one of FIG. 2, but with the advantage of a much higher input impedance. In fact, if one considers the circuit of FIG. 2, all of the signal current $I_R$ which flows in the resistor R due to the signal $V_i$ also flows in the input bipolar transistors: the base current to the signal in said bipolar transistors is therefore equal to $I_R/\beta$, where $\beta$ is the current gain of the bipolar transistors. In the circuit according to the invention, instead, only a small fraction of $I_R$ reaches the bipolar transistors (as mentioned above), and therefore the base current of said transistors is equal to the same fraction of $I_R$ divided by the $\beta$ of said transistors. The input impedance for small signals is therefore much higher. On the basis of the equivalent circuit for small signals, it can be easily checked that the input resistance $R_i$ of the amplifier of FIG. 4 is:

$$R_i = r_{be} + [(\beta + 1) + g_{m1} r_{ds5} \beta] R/2$$

and the gain $V_o/V_i$ is:

$$\frac{V_o}{V_i} = \frac{g_{m3} r_{ds5} \beta}{(2 r_{be}/R) + (\beta + 1) + g_{m1} r_{ds5} \beta} \cdot \frac{2R_L}{R}$$

where $g_{m1}$ and $g_{m3}$ are the transconductances of the MOS transistors M1 and M3 and $r_{ds5}$ is the resistance between the drain and the source of the MOS transistor M5. The value of $g_{m3} r_{ds5}$ is high (certainly higher than 100, provided that the MOS transistors are dimensioned appropriately), and is furthermore multiplied by $\beta$. The input impedance is therefore very high, and the gain is close to $2R_L/R$.

One of the advantages of the circuit according to the invention is that it can operate correctly even for very small power supply voltages, differently from the one of FIG. 3. The minimum voltage which can be used without making the devices leave their correct operation region is in fact lower than 2 volts. Distortion is also very low, since as mentioned the current variation due to the input signal $V_i$ in the bipolar input transistors is very small. Due to this reason, said devices operate in a very linear region, and the total distortion is dominated by the linearity of the emitter degeneration resistor.

Noise is only slightly higher than in an entirely bipolar circuit, since the dominant noise is that of the input transistors, which are indeed bipolar and therefore produce little noise, whereas the noise increase due to the MOS transistors is limited.

As seen above, the circuit according to the invention is made entirely with CMOS transistors and resistors, except for the two input bipolar transistors Q1 and Q2. The circuit can therefore be manufactured in mixed bipolar/CMOS technology, such as the so-called BCD technology, or also, in view of the absence of DMOS power transistors, in the simpler and less expensive BiCMOS technology. If one considers the fact that high performance is not required of the transistors Q1, Q2, said transistors can even be obtained more economically as lateral bipolar transistors within a purely CMOS technology, for example as described in the article "MOS Transistors Operated in the Lateral Bipolar Mode and their Application in CMOS Technology", by Eric A. Vittoz in IEEE Journal of Solid-State Circuits, vol. SC-18, no. 3, pages 273-279, June 1983. This possibility is one of the important advantages of the invention. A preferred embodiment of the invention has been described, but it is understood that the expert in the field may devise other modifications and variations comprises within the scope of the inventive concept.

Where technical features mentioned in any claim are followed by reference signs, those reference signs have been included for the sole purpose of increasing the intelligibility of the claims and accordingly, such reference signs do not have any limiting effect on the scope of each element identified by way of example by such reference signs.

I claim:

1. A differential amplifier which receives a differential input signal and produces an output signal, the amplifier in integrated circuit form, comprising:

a first bipolar input transistor and a second bipolar input transistor, each of said first and second bipolar input transistors having a base, a collector, and an emitter, each of the bases being adapted to receive said differential input signal;

first and second power terminals;

a first fixed current source connected between the emitter of said first bipolar input transistor and said first power terminal;

a second fixed current source connected between the emitter of said second bipolar input transistor and said first power terminal;

a resistor connected between the emitter of said first bipolar input transistor and the emitter of said second bipolar input transistor;

a third fixed current source connected between the collector of said first bipolar input transistor and said second power terminal;

a fourth fixed current source connected between the collector of said second bipolar input transistor and said second power terminal;

a first MOS amplifier device which includes at least a first MOS transistor having a gate, a source and a drain and the gate thereof is connected to the collector of said first bipolar input transistor and the drain and source thereof are connected in series with a first load impedance between said first and said second power terminals; and a second MOS amplifier device which includes at least a second MOS transistor having a gate, a source and a drain and the gate thereof is connected to the collector of said second bipolar input transistor and the drain and source thereof are connected in series with a second load impedance between said first and said second power terminals, and said output signal of said differential amplifier is produced between the junction of said first MOS transistor and said first load impedance and the junction of said second MOS transistor and said second load impedance.

2. A differential amplifier in integrated circuit form in accordance with claim 1 wherein said third fixed current source provides a smaller current than that of said first fixed current source, and wherein said fourth fixed current source provides a smaller current than that of said second fixed current source.

3. A differential amplifier in integrated circuit form comprising:
- a first bipolar input transistor and a second bipolar input transistor, each of said first and second bipolar input transistors having a base, a collector, and an emitter, each of the bases being adapted to receive a differential input signal;
- a first fixed current source connected to the emitter of said first bipolar input transistor;
- a second fixed current source connected to the emitter of said second bipolar input transistor;
- a resistor connected between the emitter of said first bipolar input transistor and the emitter of said second bipolar input transistor;
- a third fixed current source connected to the collector of said first bipolar input transistor;
- a fourth fixed current source connected to the collector of said second bipolar input transistor;
- a first MOS amplifier device having an input terminal which is connected to the collector of said first bipolar input transistor wherein said first MOS amplifier device comprises a first pair of MOS transistors, each of said MOS transistors having a source, a gate and a drain; the sources of said first pair of MOS transistors being connected to a ground; the gates of said first pair of MOS transistors being connected together to act as said input terminal of said first MOS amplifier device; the drain of one of the MOS transistors in said first pair being connected to the first fixed current source; and the drain of the other one of the MOS transistors in said first pair being connected to a first load resistor which is adapted to be connected to a voltage supply; and
- a second MOS amplifier device having an input terminal which is connected to the collector of said second bipolar input transistor wherein said second MOS amplifier device comprises a second pair of MOS transistors, each of the MOS transistors in said second pair of MOS transistors having a source, a gate and a drain; the sources of said second pair of MOS transistors being connected to a ground; the gates of said second pair of MOS transistors being connected together to act as said input terminal of said second MOS amplifier device; the drain of one of the MOS transistors in said second pair being connected to the second fixed current source; and the drain of the other one of the MOS transistors in said second pair being connected through a second load resistor to a voltage supply.

4. A differential amplifier in integrated circuit form in accordance with claim 3 wherein a first output node is connected to the drain of said other one of the MOS transistors in said first pair, and wherein a second output node is connected to the drain of said other one of the MOS transistors in said second pair.

5. A differential amplifier in integrated circuit form in accordance with claim 4 wherein each of said first, second, third, and fourth fixed current sources comprises a MOS transistor having a fixed bias voltage applied to the gate thereof.

6. A method of operation for a differential amplifier which receives a differential input signal and produces an output signal therefrom, comprising the steps of:
- driving base terminals of first and second bipolar transistors with said differential input signal, each of said bipolar transistors having base, emitter and collector terminals,
- providing respective fixed currents to the emitter terminals of said first and second bipolar transistors,
- providing respective fixed currents from the collector terminals of said first and second bipolar transistors, wherein the fixed current from the collector terminal for each of said bipolar transistors is less than the fixed current to the emitter terminal for each of the corresponding ones of said bipolar transistors,
- coupling said emitter terminals together through a resistor,
- driving an input terminal of a first MOS amplifier with a signal taken at the collector terminal of said first bipolar transistor wherein said first MOS amplifier includes first and second MOS transistors each having gate, drain and source terminals, the gate terminals of said first and second MOS transistors connected together to comprise said input terminal of said first MOS amplifier, said first MOS transistor source and drain terminals connected in series with a first load impedance between first and second power terminals, said second MOS transistor source and drain terminals connected between the emitter of said first bipolar transistor and said second power terminal,
- driving an input terminal of a second MOS amplifier with a signal taken at the collector terminal of said second bipolar transistor wherein said second MOS amplifier includes third and fourth MOS transistors each having gate, drain and source terminals, the gate terminals of said third and fourth MOS transistors connected together to comprise said input terminal of said second MOS amplifier, said third MOS transistor source and drain terminals connected in series with a second load impedance between said first and second power terminals, said fourth MOS transistor source and drain terminals connected between the emitter of said second bipolar transistor and said second power terminal, and
- producing said output signal between the junction of said first MOS transistor and said first load impedance and the junction of said third MOS transistor and said second load impedance.

* * * * *